United States Patent [19]

Millard

[11] Patent Number: 4,524,317

[45] Date of Patent: Jun. 18, 1985

[54] PRECISION, DYNAMIC LOW VOLTAGE MEASUREMENT SYSTEM

[76] Inventor: Leff Millard, R.D. #2 Box 288E, Whitehouse Station, N.J. 08889

[21] Appl. No.: 525,726

[22] Filed: Aug. 23, 1983

[51] Int. Cl.³ .............................................. G05F 3/08
[52] U.S. Cl. .................... 323/224; 323/231; 323/270; 323/353; 340/661
[58] Field of Search ............. 323/270, 297, 353, 354, 323/224, 231, 281; 340/660, 661

[56] References Cited

U.S. PATENT DOCUMENTS 3,534,353  10/1970  Calkin et al. .................. 340/661
4,412,347  10/1983  Lipcon ........................... 323/281

FOREIGN PATENT DOCUMENTS 2914840  10/1979  Fed. Rep. of Germany ...... 340/661
59320    5/1981   Japan ............................. 323/354

Primary Examiner—William H. Beha, Jr.
Attorney, Agent, or Firm—Ronald G. Goebel

[57] ABSTRACT

A voltage divider used to supply multiple reference voltages is energized electrically, in shunt, by a constant voltage generator and, in series, by a constant current generator. The magnitude of current supplied by the constant current generator determines the voltage drops across successive resistor stages of the voltage divider, while the magnitude of voltage supplied by the constant voltage generator determines the voltage level, with respect to ground, of the voltage-divider tap to which the constant voltage generator is connected. Since these two generators are independent of each other, it is possible to independently control the range and zero point settings of a voltage divider.

4 Claims, 3 Drawing Figures

PRECISION, DYNAMIC LOW VOLTAGE MEASUREMENT SYSTEM

BACKGROUND

Traditional types of electrical analog voltage or current measuring instruments are being replaced increasingly by various kinds of digital measuring instruments, including the dot or bar display instruments. In these, a series of light emitters are sequentially energized as the voltage or current monotonically varies. Thus, a moving mechanical pointer is replaced by a moving light.

Such displays employ a voltage divider having a plurality of successive tapping points which provide a corresponding series of successively different reference voltage levels. The unknown voltage to be indicated is compared in a series of comparators with the said successive different reference voltage levels to furnish a corresponding series of binary outputs indicating whether the unknown voltage is higher or lower than the respective reference voltage level. These binary outputs control the energization of respective light emitters.

In the past, it has been the practice to electrically energize the voltage divider by applying a controlled voltage to one end of the voltage divider while the other end is connected to ground. See, for example, the disclosures in the U.S. patents issued to Kugelmann et al, Nos. 3,987,392, Lazowski, 4,092,591, and Weber, 4,318,152.

Further, it is obvious that different voltages could be applied to the two ends of the voltage divider, rather than to connect one end to ground.

For example, the National Semiconductor Corporation's data sheet for their LM 3914 Dot/Bar Display Driver ©1981 states that "the internal 10-step divider is floating and can be referenced to a wide range of voltages" and includes an application example wherein the voltages applied to the ends of the internal 10-step voltage divider are 4.5 and 5.0 volts, giving an expanded range of 0.5 volts with a suppressed zero.

CROSS REFERENCE TO RELATED APPLICATION

Applicant has pending no other application which is related to the instant application.

SUMMARY

A voltage divider is supplied with electrical bias by two independent generators. One is a constant voltage generator, and one is a constant current generator.

The constant current generator is connected in series with the voltage divider so that the constant current I flows through the voltage divider, and thereby determines the magnitude of voltage between successive tapping points, regardless of whether the voltage divider is floating or is grounded at some point. The constant voltage generator is connected in shunt to the voltage divider and may, or may not, be part of the path through which the constant current I flows. But in any event, it will directly determine the precise potential, with respect to ground, of the tap of the voltage divider to which the constant voltage generator is attached, and indirectly, by consequences of Ohms' law, the potentials of all the other taps of the voltage divider.

Since the constant voltage generator and the constant current generator can be independently chose, or independently regulated, it follows that there are two degrees of freedom in the system, permitting choice of separation of successive voltage levels at successive taps independently of the average voltage level of these successive taps above ground.

THE DRAWINGS

DETAILED DESCRIPTION

Figure 1:
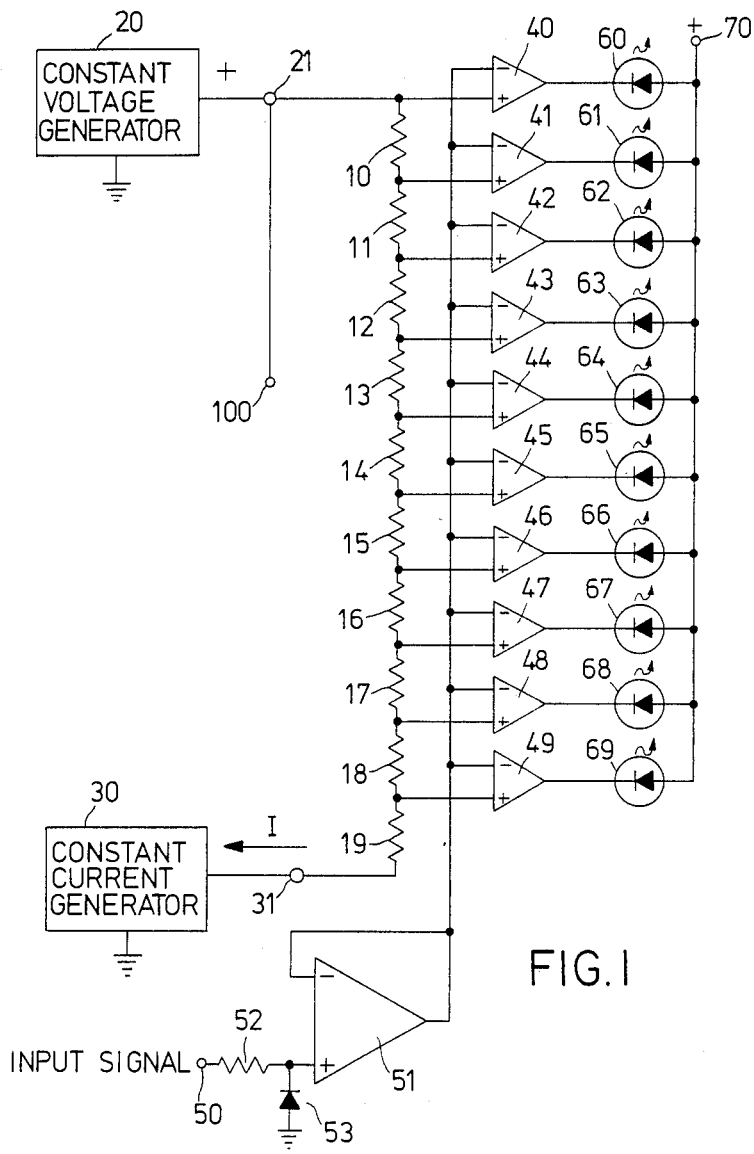
FIG. 1 is a schematic diagram of a voltage divider and its electrical energizing circuit in accordance with the invention, combined with means to display the voltage of an input signal on a L.E.D. bar display.

In FIG. 1 a voltage divider, consisting of a series string of ten resistors 10 through 19, is connected between terminal 21 of constant voltage generator 20 and terminal 31 of constant current generator 30. The top end of the resistor string and the junctions between successive resistors are tapping points which are individually connected to the non-inverting input terminals of a respective one of ten differential amplifiers 40 through 49. The inverting inputs of differential amplifiers 40 through 49 are strapped together and receive a variable input signal, applied to terminal 50, by way of a buffer amplifier 51.

Buffer amplifier 51 presents a high input impedance to the input signal at terminal 50, thereby not loading the said signal. A high value resistor 52 and a clamping diode 53 protect the circuitry from damage by excessive negative or positive input signals.

The differential amplifiers 40 through 49 have high gain and are powered by bias from a low voltage source, not shown. As the differential input to these differential amplifiers varies, the output can vary only between limits set by the voltage of the positive and negative sides of the bias supply. Thus, the differential inputs to the differential amplifiers (except when the differential inputs are under about one millivolt in value) will normally drive the differential amplifiers to one or the other extreme value of output, as limited by the bias supply. Thus, the differential amplifiers, in this circuit, are not used in their linear range, but are used as comparators to switch their outputs between high and low, depending on whether, respectively, the inverting input (from the unknown input signal) is lower and higher than the non-inverting input (from the voltage divider).

The output of each differential amplifier 40 through 49 is connected to a respective one of the light-emitting diodes 60 through 69. These light emitting diodes are also connected in common to a positive bias source 70. With the poling of the light emitting diodes as shown in FIG. 1, a diode will light up with forward biasing current when its associated amplifier output is low and will turn off when that output is high and the diode is back-biased.

Since the voltage divider 10 through 19 provides a plurality of successively different bias levels at the tapping points, it follows that, as the input signal increases by a sufficient amount, an additional light emitting diode will light up. The array of adjacent light emitting diodes will have the appearance of a light bar whose length varies with the input signal.

Figure 2:
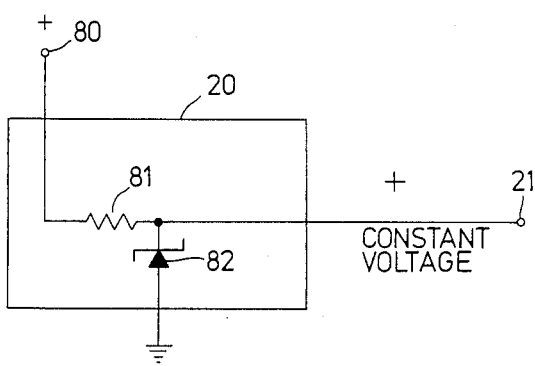
FIG. 2 is a simple constant voltage generator for use with the system of FIG. 1.

The constant voltage generator 20 may be any one of many well known types. Since the voltage divider will draw only a small current from the constant voltage generator 20, a simple generator as shown in FIG. 2 is satisfactory. Positive bias from terminal 80 is applied by way of limiting resistor 81 to Zener diode 82. A Zener diode has a characteristic sharply defined breakdown voltage when back-biased, and the current through the Zener diode will not affect the value of said breakdown voltage or cause destruction of the Zener diode, if properly limited by a limiting resistor. The choice of a particular Zener diode determines the value of the constant voltage available at terminal 21 and a range of voltage is available commercially.

The constant current generator 30 may be any one of many well known types. Since the current passing through the voltage divider is small, a simple constant current circuit such as shown in FIG. 3 is satisfactory.

The current from terminal 31 passes through a junction field effect transistor 91 and through a load resistor 92 to ground. It is characteristic of J-FETS in this configuration that the current I will be substantially constant over a wide range of positive voltages applied to terminal 31. The current tends to be throttled by the increasing size of the depletion region which intrudes into the conducting region between the ohmic source and ohmic drain electrodes whenever the said current tends to increase. Thus the current I is kept constant by a stabilizing feed-back action.

Figure 3:
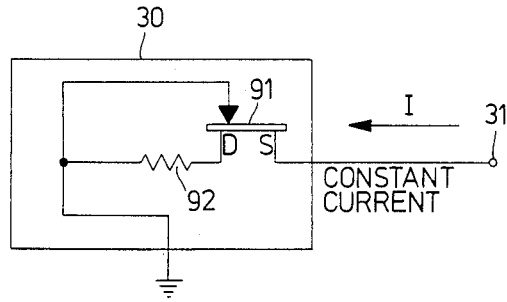
FIG. 3 is a simple constant current generator for use with the system of FIG. 1.

In FIG. 3 the constant current generator is passive, and does not have its own power supply. It acts to limit the current I coming from some source of electrical power. In this configuration the constant current generator 30 can be considered to be a constant current sink, supplied by the constant voltage generator 20, which can be considered to be a constant voltage source. The nomenclature source and sink is useful and common in describing the one way flow of electricity from positive to negative.

It is to be noted, however, that the constant current generator 30 of FIG. 1 need not be a passive type, but can be an active type which can supply energy to the flow of constant current I by causing that constant current to flow despite the fact that the lowermost end of resistor 19 may vary or may be a potential far removed from ground. Furthermore, since a flow of electric current I into a sink, such as the lead 31 requires that the current I go somewhere else, the constant current generator of FIG. 3 can, with equal validity be regarded as both a sink (terminal 31) and a source (the ground) of current. If that source of current were not connected directly to ground, as shown in FIG. 3, but were connected instead to the terminal 100 of FIG. 1, a constant current I would flow through this loop circuit: Terminal 21, resistors 10 through 19, terminal 31, terminal 100, back to terminal 21. This would require constant current generator 30 to supply power and therefore to be an active rather than passive type. Furthermore, constant voltage generator 20, in that case, would no longer supply any current to the voltage divider. The voltage divider would be floating and not referenced to ground if the constant voltage generator 20 were disconnected. Finally, the constant voltage generator 20 could be attached to any point on the voltage divider to reference the voltage divider to ground. That is, it need not be connected to the top end of resistor 10.

From what has been described it is apparent that the circuit described provides two degrees of freedom to the user. The constant current generator 30 determines the magnitude of the voltage increments for the lighting of successive LEDs. And the constant voltage generator 20 determines how far from zero those increments shall be, or whether zero will be center scale, at the right margin or suppressed beyond the left margin.

I claim:

1. For use as a stepwise voltage reference:
   a voltage divider consisting of a string of series connected resistors with tapping points along said string;
   means for generating a constant current;
   means for generating a constant voltage;
   means for causing said constant current to flow through said series connected resistor string;
   means for connecting said constant voltage to one point on said string of series connected resistors.

2. The subject matter of claim 1 in which said constant current generator is connected to one end of said string of series connected resistors.

3. The subject matter of claim 2 in which said constant voltage generator is connected to the opposite end of said string of series connected resistors.

4. The subject matter of claim 1 in which said voltage divider provides stepwise voltage reference potentials to an electronic measuring instrument.

* * * * *